(12) United States Patent
Goto et al.

(10) Patent No.: US 8,444,869 B1
(45) Date of Patent: May 21, 2013

(54) SIMULTANEOUS FRONT SIDE ASH AND BACKSIDE CLEAN

(75) Inventors: Haruhiro Harry Goto, Saratoga, CA (US); David Cheung, Foster City, CA (US)

(73) Assignee: Novellus Systems, Inc., Fremont, CA (US)

( * ) Notice: Subject to any disclaimer, the term of this patent is extended or adjusted under 35 U.S.C. 154(b) by 48 days.

(21) Appl. No.: 12/786,230

(22) Filed: May 24, 2010

Related U.S. Application Data

(63) Continuation of application No. 11/548,801, filed on Oct. 12, 2006, now Pat. No. 7,740,768.

(51) Int. Cl.
*H01L 21/302* (2006.01)

(52) U.S. Cl.
USPC .......... 216/67; 216/49; 216/64; 438/710; 438/715; 438/725; 438/730; 438/928; 134/1.2

(58) Field of Classification Search
None
See application file for complete search history.

(56) References Cited

U.S. PATENT DOCUMENTS

| | | | |
|---|---|---|---|
| 4,201,579 A | 5/1980 | Robinson et al. | |
| 4,357,203 A | 11/1982 | Zelez | |
| 4,699,689 A * | 10/1987 | Bersin ................ | 438/709 |
| 5,122,225 A | 6/1992 | Douglas | |
| 5,158,644 A | 10/1992 | Cheung et al. | |
| 5,292,393 A | 3/1994 | Maydan et al. | |
| 5,354,386 A | 10/1994 | Cheung et al. | |
| 5,593,541 A | 1/1997 | Wong et al. | |
| 5,626,678 A | 5/1997 | Sahin et al. | |
| 5,633,073 A | 5/1997 | Cheung et al. | |
| 5,660,682 A | 8/1997 | Zhao et al. | |
| 5,707,485 A * | 1/1998 | Rolfson et al. ........ | 438/716 |
| 5,767,021 A | 6/1998 | Imai et al. | |
| 5,792,269 A | 8/1998 | Deacon et al. | |
| 5,811,358 A | 9/1998 | Tseng et al. | |
| 5,814,155 A | 9/1998 | Solis et al. | |

(Continued)

FOREIGN PATENT DOCUMENTS

JP 2007/019367 1/2007

OTHER PUBLICATIONS

Kikuchi et al., Native Oxide Removal on Si Surfaces by NF3-Added Hydrogen and Water Vapor Plasma Downstream Treatment, Jpn J. Appl. Phys. vol. 33 (1994), pp. 2207-2211, Part 1, No. 4B, Apr. 1994.

(Continued)

*Primary Examiner* — Anita Alanko
(74) *Attorney, Agent, or Firm* — Weaver Austin Villeneuve & Sampson LLP

(57) ABSTRACT

A method and apparatus for cleaning a wafer. The wafer is heated and moved to a processing station within the apparatus that has a platen either permanently in a platen down position or is transferable from a platen up position to the platen down position. The wafer is positioned over the platen so as not to contact the platen and provide a gap between the platen and wafer. The gap may be generated by positioning the platen in a platen down position. A plasma flows into the gap to enable the simultaneous removal of material from the wafer front side, backside and edges. The apparatus may include a single processing station having the gap residing therein, or the apparatus may include a plurality of processing stations, each capable of forming the gap therein for simultaneously removing additional material from the wafer front side, backside and edges.

17 Claims, 5 Drawing Sheets

U.S. PATENT DOCUMENTS

| | | | |
|---|---|---|---|
| 5,817,406 A | 10/1998 | Cheung et al. | |
| 5,820,685 A | 10/1998 | Kurihara et al. | |
| 5,830,775 A | 11/1998 | Maa et al. | |
| 5,844,195 A | 12/1998 | Fairbairn et al. | |
| 5,900,351 A | 5/1999 | Lutsic et al. | |
| 5,908,672 A | 6/1999 | Ryu et al. | |
| 5,911,834 A | 6/1999 | Fairbairn et al. | |
| 5,968,324 A | 10/1999 | Cheung et al. | |
| 5,980,770 A | 11/1999 | Ramachandran et al. | |
| 6,039,834 A | 3/2000 | Tanaka et al. | |
| 6,045,618 A | 4/2000 | Raoux et al. | |
| 6,054,379 A | 4/2000 | Yau et al. | |
| 6,072,227 A | 6/2000 | Yau et al. | |
| 6,077,764 A | 6/2000 | Sugiarto et al. | |
| 6,083,852 A | 7/2000 | Cheung et al. | |
| 6,086,952 A | 7/2000 | Lang et al. | |
| 6,098,568 A | 8/2000 | Raoux et al. | |
| 6,107,184 A | 8/2000 | Mandal et al. | |
| 6,127,262 A | 10/2000 | Huang et al. | |
| 6,129,091 A | 10/2000 | Lee et al. | |
| 6,130,166 A | 10/2000 | Yeh | |
| 6,156,149 A | 12/2000 | Cheung et al. | |
| 6,171,945 B1 | 1/2001 | Mandal et al. | |
| 6,184,134 B1 | 2/2001 | Chaudhary et al. | |
| 6,187,072 B1 | 2/2001 | Cheung et al. | |
| 6,193,802 B1 | 2/2001 | Pang et al. | |
| 6,194,628 B1 | 2/2001 | Pang et al. | |
| 6,203,657 B1 | 3/2001 | Collison et al. | |
| 6,204,192 B1 | 3/2001 | Zhao et al. | |
| 6,209,484 B1 | 4/2001 | Huang et al. | |
| 6,230,652 B1 | 5/2001 | Tanaka et al. | |
| 6,245,690 B1 | 6/2001 | Yau et al. | |
| 6,277,733 B1 | 8/2001 | Smith | |
| 6,281,135 B1 | 8/2001 | Han et al. | |
| 6,287,990 B1 | 9/2001 | Cheung et al. | |
| 6,303,523 B2 | 10/2001 | Cheung et al. | |
| 6,306,564 B1 | 10/2001 | Mullee | |
| 6,319,842 B1 | 11/2001 | Khosla et al. | |
| 6,324,439 B1 | 11/2001 | Cheung et al. | |
| 6,340,435 B1 | 1/2002 | Bjorkman et al. | |
| 6,342,446 B1 | 1/2002 | Smith et al. | |
| 6,348,725 B2 | 2/2002 | Cheung et al. | |
| 6,350,701 B1 | 2/2002 | Yamazaki | |
| 6,358,573 B1 | 3/2002 | Raoux et al. | |
| 6,361,707 B1 | 3/2002 | Tanaka et al. | |
| 6,365,516 B1 | 4/2002 | Frenkel et al. | |
| 6,395,092 B1 | 5/2002 | Sugiarto et al. | |
| 6,413,583 B1 | 7/2002 | Moghadam et al. | |
| 6,426,304 B1 | 7/2002 | Chien et al. | |
| 6,448,187 B2 | 9/2002 | Yau et al. | |
| 6,465,964 B1 | 10/2002 | Taguchi et al. | |
| 6,511,903 B1 | 1/2003 | Yau et al. | |
| 6,511,909 B1 | 1/2003 | Yau et al. | |
| 6,517,913 B1 | 2/2003 | Cheung et al. | |
| 6,537,422 B2 | 3/2003 | Sakuma et al. | |
| 6,537,929 B1 | 3/2003 | Cheung et al. | |
| 6,541,282 B1 | 4/2003 | Cheung et al. | |
| 6,555,472 B2 | 4/2003 | Aminpur | |
| 6,562,544 B1 | 5/2003 | Cheung et al. | |
| 6,562,690 B1 | 5/2003 | Cheung et al. | |
| 6,569,257 B1 | 5/2003 | Nguyen et al. | |
| 6,593,247 B1 | 7/2003 | Huang et al. | |
| 6,596,655 B1 | 7/2003 | Cheung et al. | |
| 6,632,735 B2 | 10/2003 | Yau et al. | |
| 6,638,875 B2 | 10/2003 | Han et al. | |
| 6,660,656 B2 | 12/2003 | Cheung et al. | |
| 6,660,663 B1 | 12/2003 | Cheung et al. | |
| 6,663,715 B1 | 12/2003 | Yuda et al. | |
| 6,669,858 B2 | 12/2003 | Bjorkman et al. | |
| 6,680,164 B2 | 1/2004 | Nguyen et al. | |
| 6,680,420 B2 | 1/2004 | Pang et al. | |
| 6,689,930 B1 | 2/2004 | Pang et al. | |
| 6,693,043 B1 * | 2/2004 | Li et al. | 438/725 |
| 6,709,715 B1 | 3/2004 | Lang et al. | |
| 6,720,132 B2 | 4/2004 | Tsai et al. | |
| 6,730,593 B2 | 5/2004 | Yau et al. | |
| 6,734,115 B2 | 5/2004 | Cheung et al. | |
| 6,743,737 B2 | 6/2004 | Yau et al. | |
| 6,764,940 B1 | 7/2004 | Rozbicki et al. | |
| 6,770,556 B2 | 8/2004 | Yau et al. | |
| 6,787,452 B2 | 9/2004 | Sudijono et al. | |
| 6,800,571 B2 | 10/2004 | Cheung et al. | |
| 6,806,207 B2 | 10/2004 | Huang et al. | |
| 6,837,967 B1 | 1/2005 | Berman et al. | |
| 6,848,455 B1 | 2/2005 | Shrinivasan et al. | |
| 6,858,153 B2 | 2/2005 | Bjorkman et al. | |
| 6,869,896 B2 | 3/2005 | Cheung et al. | |
| 6,900,135 B2 | 5/2005 | Somekh et al. | |
| 6,902,682 B2 | 6/2005 | Shang et al. | |
| 6,930,061 B2 | 8/2005 | Cheung et al. | |
| 7,023,092 B2 | 4/2006 | Yau et al. | |
| 7,070,657 B1 | 7/2006 | Cheung et al. | |
| 7,074,298 B2 | 7/2006 | Gondhalekar et al. | |
| 7,160,821 B2 | 1/2007 | Huang et al. | |
| 7,186,648 B1 | 3/2007 | Rozbicki et al. | |
| 7,202,176 B1 | 4/2007 | Goto et al. | |
| 7,205,249 B2 | 4/2007 | Cheung et al. | |
| 7,227,244 B2 | 6/2007 | Bjorkman et al. | |
| 7,288,484 B1 | 10/2007 | Goto et al. | |
| 7,297,635 B2 * | 11/2007 | Toda et al. | 438/706 |
| 7,344,993 B2 * | 3/2008 | Balasubramaniam et al. | 438/706 |
| 7,390,755 B1 | 6/2008 | Chen et al. | |
| 7,432,209 B2 | 10/2008 | Delgadino et al. | |
| 7,465,680 B2 | 12/2008 | Chen et al. | |
| 7,468,326 B2 | 12/2008 | Chen et al. | |
| 7,556,712 B2 | 7/2009 | Yi et al. | |
| 7,560,377 B2 | 7/2009 | Cheung et al. | |
| 7,569,492 B1 | 8/2009 | Chen et al. | |
| 7,585,777 B1 | 9/2009 | Goto et al. | |
| 7,595,005 B2 | 9/2009 | Balasubramaniam | |
| 7,597,816 B2 | 10/2009 | Chang et al. | |
| 7,601,272 B2 | 10/2009 | Nguyen et al. | |
| 7,628,864 B2 | 12/2009 | Moriya et al. | |
| 7,651,949 B2 * | 1/2010 | Jo | 438/725 |
| 7,740,768 B1 | 6/2010 | Goto et al. | |
| 8,058,178 B1 | 11/2011 | Goto et al. | |
| 8,058,181 B1 | 11/2011 | Chen et al. | |
| 2001/0014529 A1 | 8/2001 | Chen et al. | |
| 2002/0000202 A1 | 1/2002 | Yuda et al. | |
| 2002/0045331 A1 | 4/2002 | Aminpur | |
| 2002/0078976 A1 | 6/2002 | Nguyen | |
| 2002/0090827 A1 | 7/2002 | Yokoshima | |
| 2002/0111041 A1 | 8/2002 | Annapragada et al. | |
| 2002/0132486 A1 | 9/2002 | Williams et al. | |
| 2002/0139775 A1 | 10/2002 | Chang et al. | |
| 2002/0185151 A1 | 12/2002 | Qingyuan et al. | |
| 2002/0187643 A1 | 12/2002 | Gu et al. | |
| 2002/0197870 A1 | 12/2002 | Johnson | |
| 2003/0045115 A1 | 3/2003 | Fang | |
| 2003/0045131 A1 | 3/2003 | Verbeke et al. | |
| 2004/0084412 A1 | 5/2004 | Waldfried et al. | |
| 2004/0248414 A1 | 12/2004 | Tsai et al. | |
| 2005/0079723 A1 | 4/2005 | Niimi et al. | |
| 2005/0106888 A1 | 5/2005 | Chiu et al. | |
| 2005/0158667 A1 | 7/2005 | Nguyen et al. | |
| 2005/0196967 A1 | 9/2005 | Savas et al. | |
| 2006/0046482 A1 | 3/2006 | Verhaverbeke | |
| 2006/0102197 A1 | 5/2006 | Chiang et al. | |
| 2006/0138399 A1 | 6/2006 | Itano et al. | |
| 2006/0154471 A1 | 7/2006 | Minami | |
| 2006/0163202 A1 | 7/2006 | Shimizu et al. | |
| 2006/0191478 A1 | 8/2006 | Gondhalekar et al. | |
| 2006/0201623 A1 | 9/2006 | Yoo | |
| 2006/0289384 A1 * | 12/2006 | Pavel et al. | 216/59 |
| 2007/0068900 A1 | 3/2007 | Kim et al. | |
| 2007/0144673 A1 | 6/2007 | Yeom | |
| 2007/0178698 A1 | 8/2007 | Okita et al. | |
| 2007/0224826 A1 * | 9/2007 | Delgadino et al. | 438/706 |
| 2007/0281491 A1 | 12/2007 | Kamp | |
| 2008/0026589 A1 | 1/2008 | Hubacek et al. | |
| 2008/0102646 A1 * | 5/2008 | Kawaguchi et al. | 438/725 |
| 2008/0248656 A1 | 10/2008 | Chen et al. | |
| 2009/0053901 A1 | 2/2009 | Goto et al. | |
| 2009/0056875 A1 | 3/2009 | Goto et al. | |
| 2009/0200268 A1 | 8/2009 | Tappan et al. | |
| 2009/0221148 A1 | 9/2009 | Uda et al. | |

| | | | |
|---|---|---|---|
| 2010/0015812 | A1 | 1/2010 | Nishikawa |
| 2011/0139175 | A1 | 6/2011 | Cheung et al. |
| 2011/0139176 | A1 | 6/2011 | Cheung et al. |
| 2011/0143548 | A1 | 6/2011 | Cheung et al. |

OTHER PUBLICATIONS

Woody K. Chung, "Downstream Plasma Removal of Mobile Ion Impurity From $SIO_2$,", Published Proceedings of the $8^{th}$ International Plasma Processing Symposium, Fall 1990, 7 pages.

Woody K, Chung, "Low Damage, Downstream RF Plasma Ashing of High Energy, Heavily Doped Implanted Resists," Semicon Korea, Dec. 1989.

A. Kalnitsky and W. K. Chung, "Characterization and Optimization of a Single Wafer Downstream Plasma Stripper," Journal of the Electrochemical Society, vol. 135, No. 9, Sep. 1988, pp. 2338-2341.

Goto et al, "Enhanced Stripping of Low-K Films Using Downstream Gas Mixing," Novellus Systems, Inc., U.S. Appl. No. 10/890,653, filed Jul. 13, 2004.

U.S. Office Action for U.S. Appl. No. 10/890,653 mailed Jul. 27, 2005.

U.S. Final Office Action for U.S. Appl. No. 10/890,653 mailed Jan. 10, 2006.

U.S. Office Action for U.S. Appl. No. 10/890,653 mailed Jun. 26, 2006.

U.S. Office Action for U.S. Appl. No. 10/890,653 mailed Oct. 11, 2006.

U.S. Office Action for U.S. Appl. No. 10/890,653 mailed Apr. 5, 2007.

Notice of Allowance for U.S. Appl. No. 10/890,653 mailed Jun. 15, 2007.

Allowed Claims for U.S. Appl. No. 10/890,653.

Supplemental Notice of Allowance for U.S. Appl. No. 10/890,653 mailed Jul. 23, 2007.

Goto et al, "Enhanced Stripping of Low-K Films Using Downstream Gas Mixing," Novellus Systems, Inc., U.S. Appl. No. 11/011,273, filed Dec. 13, 2004.

Notice of Allowance for U.S. Appl. No. 11/011,273 mailed Nov. 28, 2006.

Allowed Claims for U.S. Appl. No. 11/011,273.

Goto et al, "Enhanced Stripping of Low-K Films Using Downstream Gas Mixing," Novellus Systems, Inc., U.S. Appl. No. 11/712,253, filed Feb. 27, 2007, pp. 1-28.

U.S. Office Action for U.S. Appl. No. 11/712,253 mailed Dec. 23, 2008.

Goto, et al., "Photoresist Strip Method for Low-K Dielectrics," U.S. Appl. No. 11/859,727, filed Sep. 21, 2007.

U.S. Office Action for U.S. Appl. No. 11/859,727 mailed Oct. 6, 2008.

Notice of Allowance for U.S. Appl. No. 11/859,727 mailed May 1, 2009.

Allowed Claims for U.S. Appl. No. 11/859,727.

Goto, et al., "High Dose Implantation Strip (HDIS) In H2 Base Chemistry," Novellus Systems, Inc., U.S. Appl. No. 12/251,305, filed Oct. 14, 2008.

Goto, et al., "Photoresist Strip Method for Low-K Dielectrics," U.S. Appl. No. 12/533,461, filed Jul. 31, 2009.

U.S. Office Action for U.S. Appl. No. 11/712,253 mailed Jul. 17, 2009.

U.S. Final Office Action for U.S. Appl. No. 11/712,253 mailed Jan. 29, 2010.

Chen, et al., "Method for Post-Etch Cleans," U.S. Appl. No. 10/137,096, May 1, 2002.

U.S. Office Action for U.S. Appl. No. 10/137,096 mailed Jul. 11, 2003.

U.S. Final Office Action for U.S. Appl. No. 10/137,096 mailed Jul. 27, 2007.

Notice of Allowance for U.S. Appl. No. 10/137,096 mailed Jan. 15, 2008.

Allowed Claims for U.S. Appl. No. 10/137,096.

Chen, et al., "Method for Post-Etch Cleans," U.S. Appl. No. 12/111,095, filed Aug. 28, 2008.

U.S. Office Action for U.S. Appl. No. 12/111,095 mailed Aug. 25, 2008.

Notice of Allowance for U.S. Appl. No. 12/111,095 mailed Apr. 3, 2009.

Allowed Claims for U.S. Appl. No. 12/111,095.

Chen, et al., "Method for Post-Etch Cleans," U.S. Appl. No. 12/502,130, filed Jul. 31, 2009.

Notice of Allowance for U.S. Appl. No. 11/548,801 mailed Feb. 17, 2010.

Cheung, et al., "Plasma Based Photoresist Removal System for Cleaning Post Ash Residue," U.S. Appl. No. 11/128,930, filed May 12, 2005.

U.S. Office Action for U.S. Appl. No. 11/128,930 mailed Sep. 13, 2006.

U.S. Final Office Action for U.S. Appl. No. 11/128,930 mailed Mar. 8, 2007.

U.S. Office Action for U.S. Appl. No. 11/128,930 mailed Mar. 19, 2007.

U.S. Office Action for U.S. Appl. No. 11/128,930 mailed Jun. 29, 2007.

U.S. Office Action for U.S. Appl. No. 11/128,930 mailed Dec. 10, 2007.

U.S. Final Office Action for U.S. Appl. No. 11/128,930 mailed Jul. 21, 2008.

U.S. Office Action for U.S. Appl. No. 11/128,930 mailed Mar. 20, 2009.

U.S. Office Action for U.S. Appl. No. 11/128,930 mailed Sep. 17, 2009.

U.S. Office Action for U.S. Appl. No. 11/128,930 mailed Feb. 26, 2010.

U.S. Final Office Action for U.S. Appl. No. 11/128,930 mailed Sep. 9, 2010.

S. Wolf and R.N. Tauber, (Silicon Processing for the VLSI Era, vol. 1—Process Technology, Lattice Press, 1986), pp. 539-543.

U.S. Office Action for U.S. Appl. No. 12/533,461 mailed Nov. 5, 2010.

U.S. Office Action for U.S. Appl. No. 12/502,130 mailed Dec. 8, 2010.

Cheung, et al. "Ultra Low Silicon Loss High Dose Implant Strip," U.S. Appl. No. 12/636,582, filed Dec. 11, 2009.

Cheung, et al. "Low Damage Photoresist Strip Method for Low-K Dielectrics," U.S. Appl. No. 12/636,601, filed Dec. 11, 2009.

Cheung, et al. "Enhanced Passivation Process to Protect Silicon Prior to High Dose Implant Strip," U.S. Appl. No. 12/963,503, filed Dec. 8, 2009.

U.S. Office Action for U.S. Appl. No. 11/712,253 mailed Mar. 1, 2011.

U.S. Office Action for U.S. Appl. No. 11/128,930 mailed May 10, 2011.

U.S. Final Office Action for U.S. Appl. No. 12/533,461 mailed May 26, 2011.

International Search Report and Written Opinion for Application No. PCT/US2010/059388 mailed Jun. 27, 2011.

International Search Report and Written Opinion for Application No. PCT/US2010/059547 mailed Jul. 13, 2011.

International Search Report and Written Opinion for Application No. PCT/US2010/059517 mailed Jul. 14, 2011.

Notice of Allowance for U.S. Appl. No. 12/533,461 mailed Aug. 12, 2011.

Allowed Claims as of Aug. 12, 2011 for U.S. Appl. No. 12/533,461.

Notice of Allowance for U.S. Appl. No. 12/502,130 mailed Aug. 12, 2011.

Allowed Claims as of Aug. 12, 2011 for U.S. Appl. No. 12/502,130.

U.S. Office Action for U.S. Appl. No. 12/251,305 mailed Nov. 2, 2011.

Notice of Allowance for U.S. Appl. No. 11/128,930 mailed Oct. 28, 2011.

Allowed Claims as of Oct. 28, 2011, for U.S. Appl. No. 11/128,930.

Chen, et al., "Methods for Stripping Photoresist and/or Cleaning Metal Regions," U.S. Appl. No. 11/696,633, filed Apr. 7, 2007.

Office Action mailed Dec. 15, 2009, for U.S. Appl. No. 11/696,633.
Office Action mailed May 26, 2010, for U.S. Appl. No. 11/696,633.
Final Office Action mailed Sep. 20, 2010, for U.S. Appl. No. 11/696,633.
Office Action mailed Jun. 6, 2011, for U.S. Appl. No. 11/696,633.
Final Office Action mailed Sep. 28, 2011, for U.S. Appl. No. 11/696,633.
Office Action mailed Jan. 27, 2012, for U.S. Appl. No. 11/696,633.

* cited by examiner

SIMULTANEOUS FRONT SIDE ASH AND BACKSIDE CLEAN

CROSS-REFERENCE TO RELATED APPLICATIONS

This application is a continuation of U.S. application Ser. No. 11/548,801, filed Oct. 12, 2006, titled "SIMULTANEOUS FRONT SIDE ASH AND BACKSIDE CLEAN," all of which is incorporated in its entirety by this reference for all purposes.

FIELD OF THE INVENTION

The present invention relates to semiconductor cleaning and, in particular, to a method and assembly for cleaning and/or removing residues simultaneously from the front side and backside of semiconductor wafers.

DESCRIPTION OF THE RELATED ART

During electronic component fabrication it is common to deposit layers or features of material onto a semiconductor wafer within a semiconductor processing chamber. While most of the chemical by-products and unused reagents are exhausted from the chamber by an exhaust pump, some residue unavoidably deposits on the chamber wall and on other surfaces within the chamber, including both the front side and back side of the processed wafer itself.

Any undesirable residue on the semiconductor process chamber must then be removed to prevent the residue from flaking off and contaminating the electronic device being fabricated. Undesirable residue on the front side and backside of the semiconductor wafer must also be removed to prevent lifting off of such material from the wafer during subsequent semiconductor processing steps, which will ultimately contaminate the semiconductor process chamber and equipment, and in turn, contaminate the wafer.

Semiconductor wafer backside contamination is created during many different semiconductor integrated circuit manufacturing steps such as, for example, coming into contact with the wafer handling/processing equipment. For example, robotic components such as end effectors, wafer chucks and wafer storage devices cause different kinds of particles to be attached to the wafer backside. Also, various chemical processes intended for front side processing of the wafer may affect the backside of the wafer. For example, residues of photo resist polymer may adhere to the wafer backside during lithographic procedures, or even metal contamination of the backside may occur during various types of dry or wet processes. It is essential to remove this wafer backside contamination since it may ultimately reach the wafer's front side, thereby harming sensitive devices, leading to overall yield degradation. Backside contamination can also affect front side planarity causing focus issues and subsequent yield loss in the lithography process.

Proposed schemes for cleaning the wafer backside generally include cleaning or removing residue on the front side of the wafer followed by cleaning of the wafer backside in a separate backside etching or cleaning system. In so doing, once the wafer front side is cleaned, the wafer may be subjected to wafer processing steps prior to cleaning the backside of the wafer. For example, as discussed above, the wafer may undergo wet processing techniques prior to cleaning its backside. In such an event, residue on the wafer backside will lift off during this wet processing causing particles to contaminate the chamber, equipment and wafer front side.

Thus, known techniques of transferring a wafer after the front side is cleaned and/or processed to another processing chamber or system for cleaning the backside of the wafer are undesirable since they are time consuming and require physical contact of the wafer which, again, can lead to front side contamination as well as damaging the wafer itself, leading to still further yield reductions. To date, none of the known wafer cleaning techniques combine the simultaneous cleaning of the wafer front side and backside in a plasma processing chamber so as to eliminate the need for a separate backside etch or strip system, prevent wafer front side contamination, and improve production yields.

Thus, what is needed is a new method and apparatus for wafer backside cleaning.

SUMMARY OF THE INVENTION

Bearing in mind the problems and deficiencies of the prior art, it is therefore an object of the present invention to provide a method and apparatus for easily, efficiently and economically cleaning a backside of a semiconductor wafer.

It is another object of the present invention to provide a method and apparatus for simultaneously cleaning a front side and a backside of a semiconductor wafer within the same processing chamber.

A further object of the invention is to provide a method and apparatus that eliminates the need for using a separate etch or strip system to clean the backside of a wafer.

Still another object of the invention is to provide a method and apparatus for cleaning a backside of a semiconductor wafer that increases production yield.

Still other objects and advantages of the invention will in part be obvious and will in part be apparent from the specification.

The above and other objects, which will be apparent to those skilled in art, are achieved in the present invention, which is directed to a method for removing material from a work piece by providing a reaction chamber having a processing station with a platen. A substrate is placed over the platen to form a gap between the substrate and the platen. A plasma is generated, and this plasma flows over the processing station and into the gap to contact both a front side and a backside of the substrate for simultaneously removing at least a portion of material from both the front side and the backside of such substrate.

In removing the material from a work piece in accordance with the invention, the platen in the processing station may reside in a downward position for forming the gap and preventing the substrate from contacting the platen. The gap that prevents the substrate from contacting the platen preferably has a height ranging from about 1 mil to about 3.0 inches.

The reaction chamber may include a plurality of processing stations each having its own platen. In this aspect, selected ones of these plurality of processing stations may be adapted to each form gaps between the substrate and the platen for simultaneously removing additional material from both the front side and backside of the substrate. In these selected processing stations, the platens therein may each reside in a platen down position for forming the gap. Upon completion of processing the substrate backside, others of the plurality of processing stations may have platens in contact with the backside of the substrate for continued processing of the front side of the substrate.

The reaction chamber may include only a single processing station with the gap between the substrate and platen. In this aspect, the plasma flows into the single processing station and into the gap for simultaneously removing the portion of material from both the front side and backside of the substrate. In so doing, the platen may reside in a downward position for forming the gap and preventing the substrate from contacting the platen. Upon completion of processing the substrate backside, the gap between the substrate and the platen in this single processing station is removed, such that, the platen contacts the backside of the substrate for continued processing of the substrate front side.

The substrate may be a semiconductor wafer, and the material removed may be photoresist and/or other residues from a semiconductor manufacturing process. The plasma is generated by applying an RF power to a plasma source. While this plasma is being generated, the substrate may be electrically grounded or it may not be held at a bias. During the present processing steps, the substrate is heated to a temperature ranging from room temperature to about 400 degrees Celsius, while the reaction chamber may have a pressure ranging from about 1 mTorr to about 5 Torr.

In another aspect, the invention is directed to a method for removing material from a work piece by providing a reaction chamber having a plurality of processing stations with a platen in each of these processing stations. A plasma is generated and the substrate is preheated to a temperature in a first station of these plurality of stations. The substrate is then transferred to a second station, wherein the substrate is positioned over the second station platen to form a gap that prevents the substrate from contacting the platen. The plasma then flows into the gap to contact the front and backside of the substrate within the second station for simultaneously removing at least a portion of material from both the front side and the backside of the substrate.

Once the substrate is processed in the second station, the method may further include transferring the substrate to a third station. The substrate is positioned over the third station platen to form another gap for preventing the substrate from now contacting the third station platen. The plasma flows into the gap in the third station to contact the front and back sides of the substrate for simultaneously removing another portion of the material from both the front side and the backside of the substrate. The substrate may then be sequentially transferred and processing in any remaining processing stations within the reaction chamber. Each gap preferably has a height ranging from about 1 mil to about 3.0 inches.

During the present material removal steps, the platens in the second and third stations may each reside in a platen down position within their respective processing stations. These platens may permanently reside in the platen down position, or they may be moveably transferable from a platen up position to a platen down position. The reaction chamber is preferably a closed processing system under a continuous vacuum. The transfer means within the reaction chamber preferably includes a number of fingers in direct contact with the backside of the substrate so that during positioning the number of fingers reside directly between the substrate and the platens to prevent contact there-between. Wherein the substrate is a semiconductor wafer, the material in need of removal may be photoresist and/or residues from a semiconductor manufacturing process. In such an embodiment, the plasma is preferably an active etching species for removing the photoresist and/or residues.

In still another aspect, the invention is directed to an apparatus for removing material from a work piece that includes a reaction chamber having a plasma source and an RF coil for generating a plasma, and a processing station with a platen. A gap resides between the platen and a substrate residing in the apparatus. A transfer means of the apparatus has a number of fingers for directly contacting a backside of the substrate whereby these fingers are positioned between the backside of the substrate and the platen. The gap of the apparatus allows for the simultaneous removal of material from both the front side and backside of the substrate using the plasma. The apparatus may further include a second processing station having a second platen and a second gap residing between the second platen and the substrate for removing additional material from both the front and back sides of the substrate.

In this aspect, the second and third station platens may each reside in a permanently affixed platen down position, or they may each be moveably transferable from a platen up position to a platen down position. The apparatus may further have a showerhead assembly that includes a showerhead for directing the plasma and any inert gas into the reaction chamber. The reaction chamber is preferably a closed processing system under a continuous vacuum.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-5 of the drawings in which like numerals refer to like features of the invention.

Described herein is a method and apparatus for semiconductor cleaning and, in particular, to a method and apparatus for simultaneously cleaning a front side and backside of a substrate or semiconductor wafer within a single multi-station stripping apparatus of the invention. It should be appreciated and understood that any type of substrate and/or wafer in need of cleaning may be used and cleaned in accordance with the invention. Also, although the present invention is discussed with reference to certain illustrated embodiments thereof, the use of such examples should not be read as limiting the broader scope of the invention. Instead, these examples are being used to more effectively convey information regarding the invention to the reader than would otherwise be possible if no such examples were used.

Figure 1:
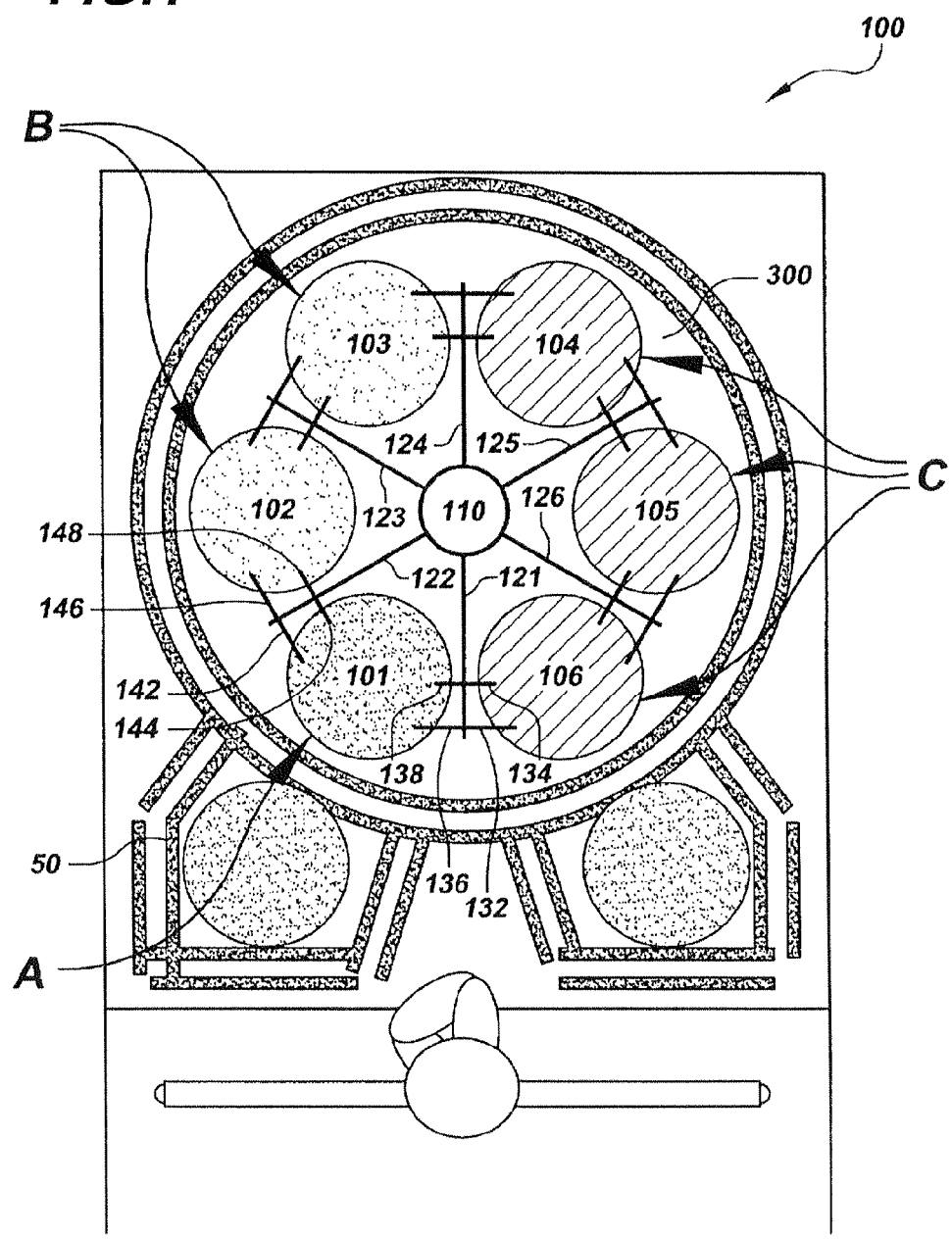
FIG. 1 illustrates a schematic drawing of a multi-station stripping tool of the invention for simultaneously processing a front side and backside of a wafer in accordance with an embodiment of the present invention.
Figure 2A:
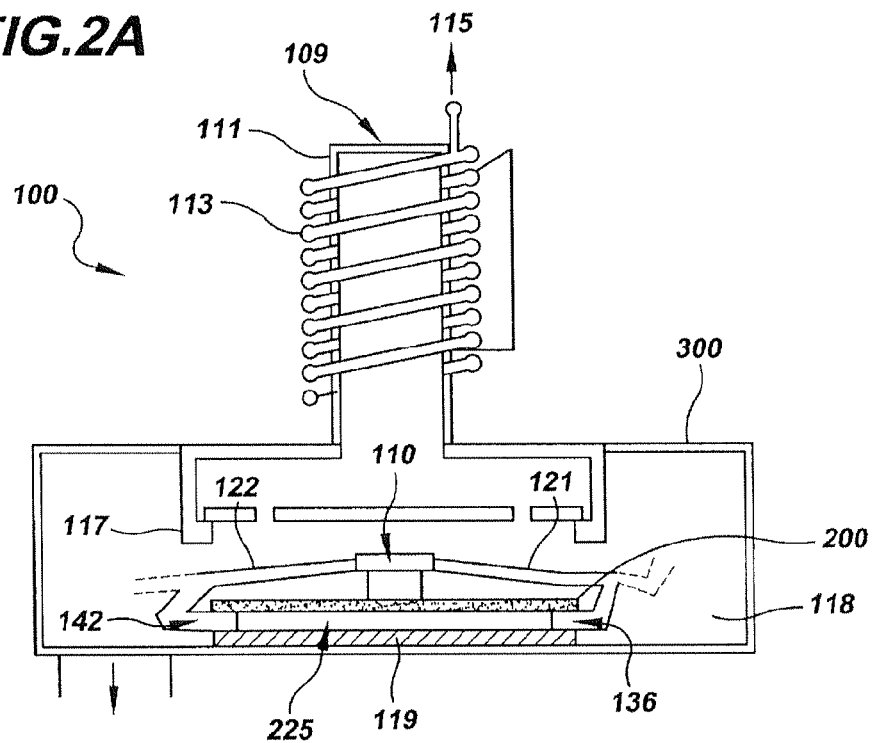
FIG. 2A illustrates a schematic side view of a single processing station of the multi-station stripping tool shown in FIG. 1 with the platen in a platen down position of the invention.
Figure 2B:
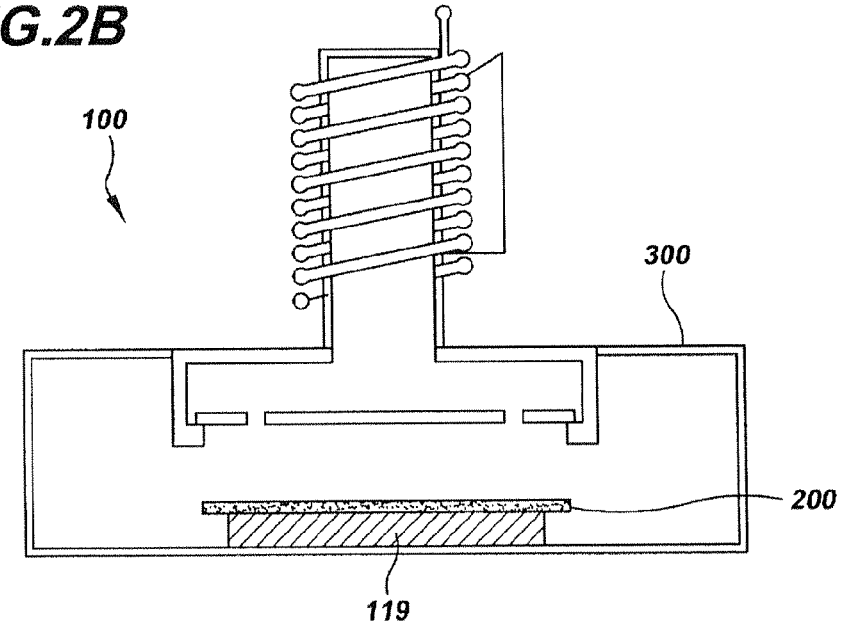
FIG. 2B illustrates a schematic side view of a single processing station of the multi-station stripping tool shown in FIG. 1 with the platen in a platen up position.

FIGS. 1, 2A and 2B show a preferred embodiment of a multi-station apparatus 100 of the invention for the simultaneous front side and backside cleaning of a wafer within the same chamber. However, it should be appreciated and understood that the invention is not limited to multi-station chambers. The invention may be implemented using an exposure chamber having a single wafer chamber, as will be discussed further below.

In some embodiments of the invention the apparatus may be a strip unit dedicated to stripping photoresist from wafers. For instance, the invention may be implemented on a Gamma® tool of Novellus Systems, Inc. that has been modified in accordance with the invention. The Novellus Gamma® tool supports the sequential processing of up to six wafers in a common process chamber and is generally used for the purposes of resist strip, clean and dielectric and silicon etch applications. However, it should be appreciated that the invention is not limited to the Novellus Gamma platform, but can be applied to other strip or etch process tool platforms.

Wherein the apparatus is a multi-station apparatus, the multi-station apparatus 100 includes a showerhead assembly 117 that separates a plasma producing portion 111 and an exposure chamber 300. During processing, a mixture of reactive and inert gases flows into the plasma producing portion 111 via a gas inlet 109. For cleaning organic materials a mixture of oxygen with nitrogen is commonly used. When the under-layer substrate is sensitive to oxidizing chemistry, a reducing chemistry such as a hydrogen plasma, with or without a dilution gas may be used. The plasma producing portion 111 is partly surrounded by induction coils 213, which in turn, are connected to a power source 215. As the gas mixture flows into portion 111, the induction coils 113 are energized to generate a plasma therein.

In a preferred embodiment, a plurality of processing stations reside inside the exposure chamber 300 for processing wafers in a sequential batch mode to increase production throughput. For illustration purposes, multi-station apparatus 100 includes six processing chambers at stations 101, 102, 103, 104, 105 and 106 for the sequential processing of up to six wafers at a time. However, it should be appreciated that the apparatus may include any number of processing stations for sequentially processing wafers. Each processing station, e.g., stations 102, 103, 104, 105 and 106, may each be provided with their own RF power supply. Each station has a platen 119 that may be adapted with a heating element, and/or configured to applying a bias to a wafer 200. As will be discussed further below, the multi-station apparatus 100 of the invention has at least one station, preferably at least two stations, or even more, adapted with platen(s) 119 that reside in a 'platen down position" for simultaneously processing the front side and the backside of a wafer 200.

For ease of understanding the invention, reference is made to three groups of processing stations. Processing station 101 is within Group A. Station 101 is typically configured with a load-lock station 50 attached thereto for allowing the input of wafers into the multi-station apparatus 100. The multi-station apparatus is configured such that it is capable of processing one wafer at a time so that all stations are exposed to a common vacuum. In so doing, the wafers are input from station 101 into the apparatus 100 without breaking vacuum. Station 101 is also configured with a heat lamp for pre-heating each wafer before it is transferred to the next processing station.

A robotic arm 110 transfers the wafer from station 101 sequentially to station 102 and then station 103 of the Group B processing stations. These Group B stations include at least one station, preferably at least two or more stations, having a platen residing in the "platen down position" of the invention. The wafer will reside over the platen, which is also called a pedestal. The platen may be heated, either resistively or with lamps, or alternatively, the platen may not be heated. As another alternative, lamps may be used to pre-heat the wafer itself. This type of lamp heating enables the wafer to be heated without contacting the backside of the wafer with a heated surface.

While the Group B processing stations immediately follow the Group A stations in this embodiment, it should be appreciated and understood that the Group B processing stations of the invention may be positioned and implemented at any location inside the exposure chamber. That is, the Group B processing stations may immediately follow the Group A stations, they may be positioned at the beginning of the sequence of processing stations residing within the exposure chamber, they may be positioned at the end of such sequence of processing stations, they may be intermittently spaced throughout the plurality of processing stations residing inside the exposure chamber, or even any combination thereof.

Wafers are transferred via a spindle assembly 110 that includes a fin with at least one arm for each processing station such that each arm extends toward the processing stations. At the end of the arm adjacent to the processing stations are four fingers that extend from the arm with two fingers on each side. These fingers are used to lift, lower and position a wafer within the processing stations. For example, in the preferred embodiment, wherein the multi-station apparatus includes six processing stations, the spindle assembly 110 is a six arm rotational assembly with six arms on one fin. For example, as shown in the drawings the fin of the spindle assembly includes six arms, e.g., arms 121, 122, 123,124, 125, 126, with each arm having four fingers, e.g., arm 121 has fingers 132, 134, 136, 138; arm 122 has fingers 142, 144, 146, 148; and the like.

A set of four fingers, i.e., two fingers on a first arm and two fingers on an adjacent, second arm, are used to lift, position and lower a wafer from one station to another station. In this manner, the apparatus is provided with four fingers per platen, per station and per wafer. Each platen 119 of the six processing stations is also provided with four openings for receiving the four fingers of adjacent arms.

Before a wafer is provided into the loading station 101, the spindle, fin, arms and fingers are positioned such that the four fingers, again two fingers on each of adjacent arms, reside within the openings of the platen that are adapted for receiving such fingers. In this manner, once a wafer 200 having surfaces in need of cleaning is loaded into station 101, the wafer rests on and directly contacts both the four fingers of the arm as well as a top surface of the platen 119 within station 101.

The wafer 200 is then pre-heated within station 101 to a temperature that will affect the removal of any debris and unwanted material from the wafer surfaces. Again, the wafer may be heated via heat transfer from a heated platen (which is heated either resistively or with lamps), or the wafer may be heated using a lamp within the reaction chamber. In so doing, the wafer is heated using a lamp without contacting the backside of the wafer with the heat source. Non-contact heating of the wafer, via a lamp within a preheat station of a sequential processing assembly, significantly increases the simultaneous backside and front side strip rate as compared to those tools that require contact of the backside of the wafer with a heat source. In heating the wafer without physically contacting any surface of the wafer with the heat source, the wafer is loaded into the preheat station and with the wafer sitting on the spindle assembly fingers, a lamp heat source within the preheat station generates heat that is directed toward the wafer for heating the surfaces thereof. Upon pre-heating the wafer, and during processing, the wafer preferably has a temperature ranging between about room temperature to about 400° C.

Once the wafer 200 is pre-heated, it may be transferred to the processing stations of Group B. The Group B processing stations include a platen 119 that is either moveably transferable from a "platen up position" to a "platen down position" of the invention, and vice versa, or the platen may permanently reside in the "platen down position." In the platen up position, as shown in FIG. 2B, the backside of the wafer 200 is in direct contact with a top surface of the platen. In the platen down position, as shown in FIG. 2A, the wafer avoids contact with the platen, including the backside of the wafer avoiding contact with the top surface of the platen, such that, a gap 225 resides between the backside of the wafer 200 and the top surface of platen 119. The platen down position and the resultant gap 225 are essential to the invention.

In transferring wafer 200 from loading/pre-heating station 101, the spindle assembly 110 moves the arms of the fin in an upward direction within the apparatus 100, thereby lifting the wafer 200 in an upward direction away from the platen of station 101 via the four fingers residing under wafer 200. The spindle then moves the wafer from station 101 to processing station 102. In accordance with the invention, the platen 119 in processing station 102 may permanently reside in the platen down position, such that, when the four fingers carrying the wafer are received in the corresponding opening portions of this platen, the backside of the wafer 200 only contacts a top surface of the four fingers. In so doing, a gap 225 resides between the wafer and the platen such that the backside of wafer 200 avoids contact with the platen 119 in processing station 102.

As an alternative embodiment, the platen 119 may be moveable from an up position to a down position, and vice versa, within station 102. In this manner, the opening portions of platen 119 in station 102 receive the four fingers carrying wafer 200. The platen 119 may already be in a platen down position, or the platen 119 may be moved from the platen up position to the down position, to provide gap 225 between wafer 200 and platen 119. Again, the gap 225 prevents the backside of wafer 200 from contacting the platen, such that the backside of the wafer only contacts the fingers residing there under. In order to maintain the wafer temperature and ensure a high strip rate, the platen may first reside in a platen up position such that upon positioning the wafer within a processing chamber, the wafer contacts the platen for heating and maintaining a temperature of the wafer. Once heated, or after a predetermined duration, the platen is lowered to the present platen down position. In so doing, the gap forms and the plasma is allowed to flow there-between contacting both the front and back sides of the wafer for removing undesirable material there-from, as well as allowing the plasma to contact the top surface of the platen to remove any undesirable material that may have been deposited due to contact with the wafer.

An essential feature of the invention is that once the wafer 200 is in processing station 102, and the platen is in the platen down position, the wafer front side, backside and edges (including any bevel edges) can be simultaneously processed, i.e., cleaned and/or removed of any undesirable debris or materials. In the platen down position, the gap 225 residing between the wafer and the platen has a height sufficient to allow the flow of plasma into gap 225 and to come into contact with the backside of the wafer. The height of this gap may range from about 1 mil to about 3.0 inches, more preferably from about 0.5 inch to about 1.0 inch, and even more preferably from about 0.7 inch to about 0.8 inch.

In a preferred embodiment, the apparatus 100 is a stripping tool such that a plasma of an active etching species is generated within the reaction chamber, or it is generated in a remote source upstream of the reaction chamber, commonly known as a "downstream" plasma. The plasma of active species flows over processing station 102 and into the gap to contact the front side (or top surface) of the wafer 200 for a time sufficient to remove about $\frac{1}{3}$ of the photoresist residing on such front side. At the same time, and for the same duration, the active etching species flows into gap 225 to directly contact the backside (or bottom surface) of the wafer to clean this backside by removing any undesirable debris and/or materials there-from. That is, by providing the platen 119 in the platen down position, the invention allows for the simultaneous processing of both the front side and the backside of the wafer, as well as the wafer edges. Preferably, chamber 300 is plumbed with gases including, but not limited to, $O_2$, $N_2$, $N_2/H_2$ and $CF_4$ for the simultaneous front side resist removal (or ash process) and backside wafer clean.

Once the front side and backside of the wafer 200 have been processed within station 102, the fingers lift the wafer up away from station 102 and the spindle moves the wafer toward processing station 103. Processing station 103 is also part of the Group B stations, and as such, is provided with the platen down position of the invention. That is, station 103 has a platen 119 that is either permanently in the platen down position, or moveable from an up position to a down position, and vice versa, to provide the gap 225 between the wafer and the platen. The fingers of adjacent arms residing under the wafer are received in the openings of platen 119 in station 103, and then once in the platen down position, both the front side and backside of the wafer, as well as the wafer edges, are simultaneously processed. The gap also enables the simultaneous processing of the wafer edges. Wherein the present apparatus 100 is a stripping tool, the active etching species flows over station 103 to contact the front side of the wafer 200 for a time sufficient to remove about another $\frac{1}{3}$ of the photoresist residing thereon, while simultaneously flowing into gap 225 to directly contact the wafer backside for the cleaning thereof.

The wafer 200 may then be transferred from the Group B processing stations to the Group C processing stations. In the Group C processing stations the backside of the wafer is provided in direct contact with the platens residing in these Group C stations. While this preferred embodiment of the multi-station processing apparatus 100 is shown with two platen down processing stations for simultaneously processing (i.e., cleaning) the wafer front side, backside and edges, it should be appreciated that the invention is not limited to two platen down stations, but may include more or less than two platen down stations for simultaneously processing the front side and backside of the wafer to a desired state or condition.

In transferring the wafer from the platen down station 103 to the next processing station, fingers on adjacent arms lift the wafer away from station 103 and the spindle moves the wafer toward processing station 104. The fingers are received into the openings in platen 119 of station 104, and then the wafer is lowered directly onto such platen. The platen 119 in stations 104, 105 and 106 are preferably stationary platens that remain in a platen up position so that the wafer backside directly contacts the top surface of the platen. The plasma flows over station 104 to directly contact the front side of wafer for a time period sufficient to strip off the remaining $\frac{1}{3}$ of photoresist. The wafer backside is not contacted with the plasma since it is in direct contact with the platen, and it has been previously cleaned in the platen down stations of the invention.

The above sequence is continued such that the wafer 200 is processed at stations 105 and 106 in the same manner as in station 105. An RF bias may be applied to each of these processing stations within Group C, i.e., stations 104, 105 and 106. At station 104, the photoresist should be essentially removed from the front side of the wafer and the backside of the wafer should be substantially cleaned or removed of any debris and/or unwanted materials. At stations 105 and 106, the wafer is over-stripped to ensure that no trace of photoresist and residues remain on the surfaces, particularly, the front surface. Processing station 106 is referred to as the unload station and is configured with a load-lock station attached thereto to allow the output of wafers from apparatus 100 without a break in vacuum.

Again, as discussed above, the invention is not limited to the Group B processing stations immediately following the Group A stations. It should be appreciated and understood that the Group B processing stations of the invention, which each include the gap of the invention residing between the platen and the wafer backside, can be positioned at any location within the plurality of processing stations within the exposure chamber. In so doing, the Group B stations may be positioned and implemented at the beginning of the sequence of the plurality of processing stations, at the end of such plurality of processing stations, the Group B stations may be intermittently spaced throughout the plurality of processing stations residing inside the exposure chamber, or even any combination thereof. For example, at least one Group B station may be positioned at the beginning of the plurality of processing stations while at least one other Group B station is positioned at the end of such plurality of processing stations.

As an alternative to the multi-station apparatus described above, the invention may be implemented as an exposure chamber having a single wafer chamber, or a chamber that is a multi-station chamber processing a wafer(s) in a single processing station in batch mode (i.e., non-sequential). In this aspect of the invention, the wafer is loaded onto the platen (pedestal) of the single processing station (whether it is an apparatus having only one processing station or an apparatus having multi-stations running in batch mode). Preferably, the wafer is then heated, such as, by providing heat lamps at the wafer backside or by resistively heating the platen. As an alternative, the wafer may have a temperature at room temperature during the present processing steps.

Once the wafer is heated, the plasma is generated and flows over the wafer's surfaces residing in the single processing chamber. This plasma may be a downstream plasma (e.g., microwave source) or it may be struck within the chamber. While the plasma is flowing, or before the plasma flows into the chamber, the gap between the wafer backside and the top side of the platen is provided. In so doing, either the platen is moved to a platen down position to create the gap of the invention, or rather than moving the platen to the platen down position, the wafer may be lifted off the platen to generate such gap. Once the gap is provided, the plasma then flows into such gap and over the wafer for simultaneously contacting the backside, front side and lateral sides of the wafer with the plasma for the simultaneous processing thereof. The gap of the present invention enables the simultaneous wafer front side ash (resist removal) and backside clean. The resist may be either partially or entirely removed from the wafer front side.

While still in the single processing chamber, and once the wafer backside processing is complete, the platen is then raised back to its starting position for contact with the processed wafer, or alternatively, the wafer itself is lowered back onto film may then be removed by contact with the plasma while in the single processing chamber. The wafer may then be unloaded from the single processing chamber, and moved to a cooling station for cooling or directly to a multiple wafer holder.

In a preferred method according to the present invention, the simultaneous front side and backside cleaning of the wafer is automated to minimize tool down time, to avoid the risk of cross contamination, as well as maintain process stability. Also, it should be appreciated that the wafer 200 may be temperature controlled and/or a RF bias may be applied at various steps of the present process and within various processing stations.

The method and apparatus of the invention have a number of advantages. For example, the method and apparatus provide for an easy, efficient and economical way of simultaneously cleaning a front side and a backside of a wafer within a single processing apparatus. These methods and apparatus eliminate the need for using a separate etch or strip system to clean a backside of a wafer, and therefore increase production throughput.

Moreover, with the removal of undesirable material and/or debris on the wafer backside using the present platen down apparatus and process, front side wafer contamination is significantly reduced during subsequent processing of the wafer in the present multi-station apparatus. It also reduces the risk of cross-contamination between wafers.

Figure 3:
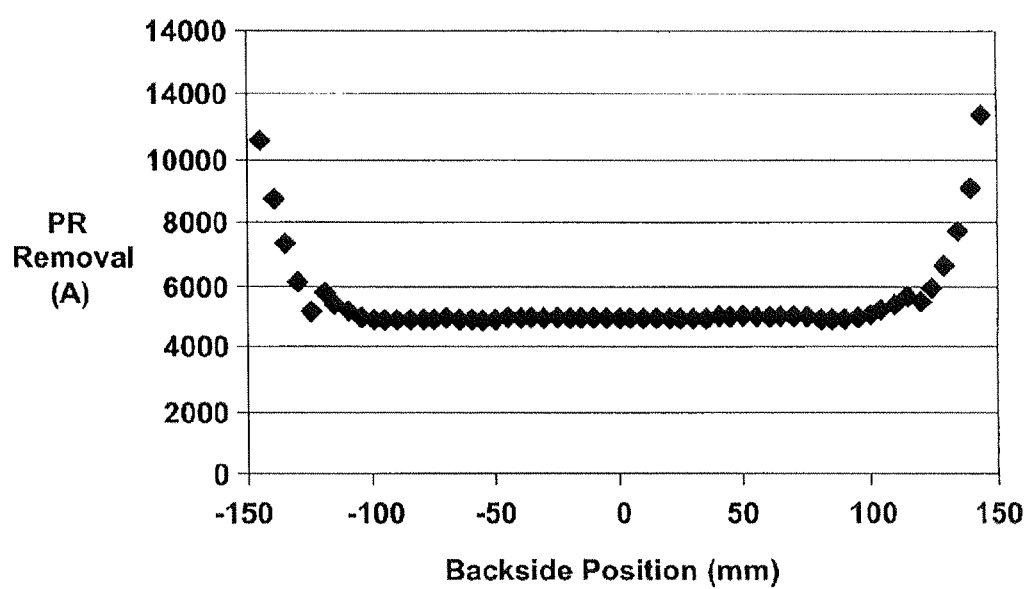
FIG. 3 illustrates a graph of the amount of resist removed from a wafer backside after the wafer has been sequentially cleaned in at least two platen down stations in accordance with the invention.
Figure 4A:
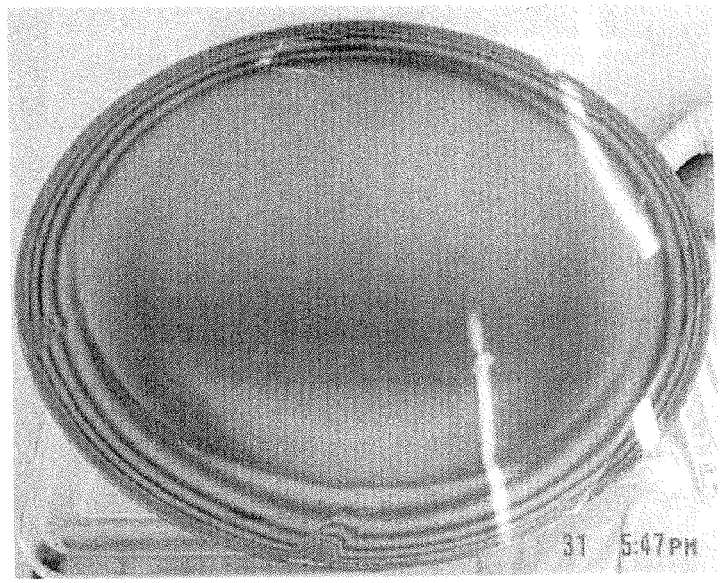
FIGS. 4A and 4B are SEM images showing the backside of the wafer used for the plot of FIG. 5 is another SEM image showing the backside of an example wafer processed in accordance with the invention.
Figure 4B:
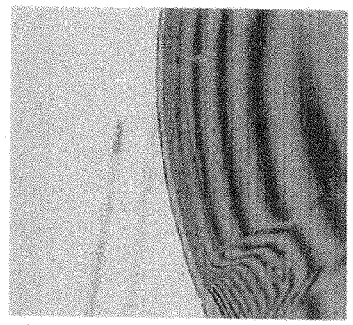
Figure 5:
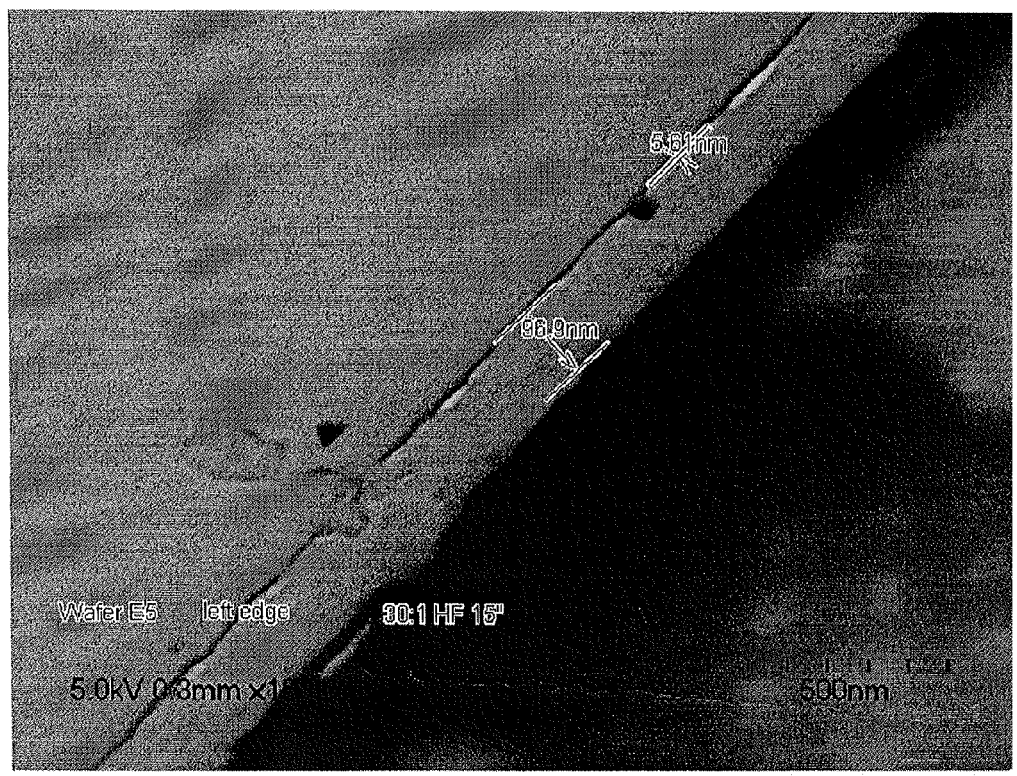

FIG. 3 is a graph presenting data obtained using the present process and apparatus. As shown, a 300 mm wafer is subjected to the present process and apparatus whereby the front side and the backside of such wafer are simultaneously processed (i.e., photoresist stripped) using the platen down position stations 102, 103 of the invention. The wafer is preheated to a temperature of about 285° C., and is preferably maintained substantially at such temperature during processing within the present apparatus 100. Oxygen flows into the apparatus at a rate of about 18 slm along with a flow of nitrogen at a flow rate of about 1.5 slm. Optionally, CF4 may be added in small amounts sufficient to assist in the removal of nonvolatile materials, such as, HMS (high dose ion implanted photoresist strip) residues on the wafer. The wafer is processed in the two platen down stations for 12 seconds/station and heated for 10 seconds. As a result, the plot of FIG. 3 shows that increased amounts of debris/material (i.e., photoresist) are removed at the edges of the 300 mm wafer as compared to the center of the wafer. FIG. 3 shows thousands of angstroms of photoresist removal across the wafer, ranging from over 10,000 angstroms at the edges and between 4000 and 6000 at the center. FIGS. 4A and 4B show SEM images of the processed 300 mm wafer of FIG. 3.

EXAMPLES

The present invention is further illustrated by way of examples, which are not meant to limit the scope of the invention.

Example 1

A wafer was provided with a SIN layer of about 2 kA, a TEOS layer of about 10 kA, an ashable hardmask (AHM) layer of about 3.6 luk (e.g., amorphous carbon deposited by CVD) and a NF antireflective layer of about 600 A. In so doing, the wafer edge and bevel, along with portions of or the entire backside of the wafer, were undesirably covered with the ashable hardmask. After the wafer was subjected to any desirable etching procedures, the wafer was then cleaned in accordance with the present method using the apparatus of the invention. That is, the wafer was cleaned in at least two sequential platen down processing chambers whereby a plasma was allowed to contact the wafer edge, bevel and backside thereof. The resultant wafer is shown in the SEM image of FIG. 5, which shows that the wafer bevel edge and wafer backside have been substantially stripped of any undesirable photoresist and/or materials. A SiN layer of about 2 kÅ resides on the wafer edge to enhance the SEM image.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of stripping photoresist from the front side of a substrate having a front side and a backside, the method comprising:
    after performing a lithographic etch process, providing a substrate having photoresist deposited on its front side to a photoresist strip chamber;
    positioning said substrate in a first position, wherein in said first position the substrate is positioned over a platen residing in said photoresist strip chamber to form a gap therein that prevents said substrate from contacting said platen;
    introducing one or more gases to a remote plasma source upstream of the photoresist strip chamber to generate a strip plasma; and
    while the substrate is in said first position, exposing the substrate to the strip plasma to remove a first portion of the photoresist from the front side of the substrate, wherein the backside of the substrate is simultaneously cleaned during removal of the first portion of photoresist from the front side.

2. The method of claim 1 wherein the photoresist is a ion implanted photoresist.

3. The method of claim 1 wherein the one or more gases comprises CF4.

4. The method of claim 1 wherein the one or more gases comprise forming gas (N2/H2).

5. The method of claim 1 wherein the one or more gases comprise O2.

6. The method of claim 1 wherein the one or more gases comprise N2.

7. The method of claim 1 wherein the one or more gases comprises H2.

8. The method of claim 1 wherein the one or more gases is O2 and N2.

9. The method of claim 1 wherein the remainder of the photoresist is removed in the photoresist strip chamber.

10. The method of claim 1 wherein the first portion is about ⅓ of the photoresist deposited on the front side prior to removal.

11. The method of claim 1 wherein the first portion is about ⅔ of the photoresist deposited on the front side prior to removal.

12. The method of claim 1 wherein the substrate temperature is maintained at about 285° C.

13. The method of claim 1 wherein thousands of angstroms of photoresist are removed from the front side.

14. A method of stripping photoresist from the front side of a substrate having a front side and a backside, the method comprising:
    after performing a lithographic etch process, providing a substrate having thousands of angstroms of photoresist deposited on its front side to a photoresist strip chamber;
    positioning said substrate in a first position, wherein in said first position the substrate is positioned over a platen residing in said photoresist strip chamber to form a gap therein that prevents said substrate from contacting said platen;
    introducing one or more gases to a remote plasma source to generate a strip plasma upstream of the photoresist strip chamber;
    while the substrate is in said first position, exposing the substrate to the strip plasma to remove a first portion of the photoresist from the front side of the substrate, wherein the backside of the substrate is simultaneously cleaned during removal of the first portion of photoresist from the front side.

15. The method of claim 14, further comprising heating the substrate via heat transfer from the platen.

16. The method of claim 14, further comprising heating the wafer by contacting the wafer with the platen.

17. The method of claim 1, further comprising, after removing the first portion of the photoresist, contacting the substrate to a platen in the photoresist strip chamber for removal of another portion of the photoresist.

* * * * *